United States Patent [19]
Oh et al.

[11] Patent Number: 5,744,812
[45] Date of Patent: Apr. 28, 1998

[54] FARADAY CUP ASSEMBLY FOR A SEMICONDUCTOR ION-IMPLANTING APPARATUS

[75] Inventors: Sang-guen Oh; Jeong-kon Kim, both of Suwon, Rep. of Korea

[73] Assignee: Samsung Electronics Co., Ltd., Suwon, Rep. of Korea

[21] Appl. No.: 773,336

[22] Filed: Dec. 26, 1996

[30] Foreign Application Priority Data

May 20, 1996 [KR] Rep. of Korea .................. 96-17070

[51] Int. Cl.⁶ .................................................. H01J 37/317
[52] U.S. Cl. ............................... 250/492.21; 250/397
[58] Field of Search ........................ 250/492.21, 397

[56] References Cited

U.S. PATENT DOCUMENTS 5,144,147  9/1992  Shiozaki et al. .................. 250/492.21
5,343,047  8/1994  Ono et al. ........................ 250/492.21
5,455,426  10/1995 Forgey et al. .................... 250/492.21

Primary Examiner—Jack I. Berman
Attorney, Agent, or Firm—Jones & Volentine, L.L.P.

[57] ABSTRACT

A Faraday cup assembly of a semiconductor ion-implanting apparatus is installed adjacent to a disc upon which a wafer can be mounted for performing an ion implantation. A micro-discharge is prevented because the Faraday cup has an inner wall covered by a conductive thin film or has a discharge tag of a predetermined size embedded in its inner wall. An ion implanting process utilizing such an apparatus ensures that contamination and quality inferiority of the wafer are prevented by preventing the build up of an insulating layer of carbon impurities on the inner wall of the Faraday cup assembly.

13 Claims, 3 Drawing Sheets

FARADAY CUP ASSEMBLY FOR A SEMICONDUCTOR ION-IMPLANTING APPARATUS

BACKGROUND OF THE INVENTION

1. Field of the Invention

The present invention relates to a Faraday cup assembly of a semiconductor ion-implanting apparatus. More particularly it relates to a Faraday cup assembly, wherein the formation of an insulating layer of impurities on an inner wall originating from out-gassing impurities caused by a continuous ion-implanting operation for a wafer is inhibited. This prevents wafer contamination resulting from a micro-discharge produced by a charge which builds up in the insulating layer.

2. Description of the Related Art

As is well known in the art, ion implantation is a technique for applying to an atomic ion an amount of energy large enough to cause the atomic ion to penetrate through a surface of a target object to implant the atomic ion into the target object. An ion-implanting apparatus is designed to carry out such an ion implantation technique.

An ion-implanting apparatus that can adjust the impurity (or dose) density within the range of $10^{14} \sim 10^{16}$ atom/cm$^3$ has been widely used in semiconductor manufacturing processes. Such an apparatus has been employed because it has an advantage in that the density is easily adjustable as compared with the employment of other impurity-implanting techniques.

The above-stated ion-implanting apparatus comprises a vacuum apparatus, an ion-supplying apparatus, an ion extracting apparatus, a scanning apparatus, an ion-injecting section, and the like. Preferably, the respective elements are supplied with a high voltage adjustable to diverse levels for performing the process. In such an apparatus, the ion is generated from an ion generating section supplied with a source gas by using the supplied voltage, and the generated ion is extracted and accelerated to implant into a wafer.

The high voltage state exerts an absolute influence upon the extraction, acceleration and operation of the respective elements and is directly associated with the dosage implanted to the wafer. Of particular influence is the Faraday cup assembly installed in a position adjacent to a disc of the ion-injecting section. The Faraday cup assembly is supplied with various bias voltages for neutralization and secondary-ion control.

Such a conventional Faraday cup assembly which performs the neutralizing and secondary-ion controlling functions has the construction shown in FIG. 1.

Positive ions, which are extracted by activating the supplied gas, are accelerated to a point where they are implanted into a wafer 14 mounted to a disc 12 via Faraday cup assembly 10. Disc 12 is connected with a net current meter 16. The Faraday cup assembly 10 is formed with a backward bias power supply source 17 for suppressing the generation of secondary ions, a beam current meter 18 for measuring total current flowing toward the backward bias power supply source 17, and a net current meter 16.

Therefore, the amount of current resulting from the supplying of a negative potential toward disc 12, which is equal to the quantity charged in order to implant the positive ions into wafer 14, is measured in net current meter 16. Also, the amount of current obtained by summing the current resulting from the negative potential that migrates to set a neutralizing environment for the Faraday cup assembly 10 and the current flowing through net current meter 16 is measured in beam current meter 18.

In the meantime, selected portions of wafer 14 are coated with a photoresist 20 in a predetermined pattern for ion implantation. Thus, some positive ions proceed through portions which are not coated with photoresist 20 and are implanted into the surface of wafer 14, while other ions proceed through the portions that are coated with photoresist 20 and are implanted in the photoresist 20 layer.

Once positive ions are implanted in photoresist 20, $H_2$ and $O_2$ included in photoresist 20 are dissolved, which results in the release of a carbon compound. The quantity of generated carbon compound differs in accordance with the ion-implanting quantity and cooling degree of the rear plane.

Some of the carbon compound generated as described above is deposited onto the inner wall of Faraday cup assembly 10 to form an insulating layer. In time, this layer builds up a charge which is caused by the charge between the beam current and Faraday cup assembly 10. The resulting insulating layer lowers the conductive property, and affects the ion path formation for controlling the secondary electrons. Neutralizing of such secondary ions is disturbed along with the storage capacitance of the insulating layer. In severe cases, the path is thoroughly shorted and the charge build-up is induced at the insulating layer.

Excessive charge build-up generates a voltage breakdown phenomenon due to the partial concentration of the current flow toward the insulating layer having the weak insulating property. Accordingly, a micro-discharge phenomenon occurs which destroys a microscopic portion of the insulating layer formed on the inner wall of Faraday cup assembly 10.

The micro-discharge is an explosive phenomenon that emits an enormous energy from an instantaneous microscopic portion and simultaneously melts a portion of the inner aluminum wall of the Faraday cup assembly 10. The melted aluminum is scattered over the surface of wafer 14 by the micro-discharge. Due to this scattering, a comet type contamination appears on the surface of wafer 14.

The above-mentioned aluminum impurity acts as an obstacle to efficiently executing the ion-implanting process and serves as a contamination source in any post-processing operation. Consequently, the above-described phenomenon adversely affects the quality of the semiconductor device and damages the Faraday cup assembly of the ion-implanting apparatus.

SUMMARY OF THE INVENTION

Accordingly, it is an object of the present invention to provide a Faraday cup assembly for a semiconductor ion-implanting apparatus which is capable of preventing a micro-discharge phenomenon by repeatedly eliminating impurities which contaminate an inner wall of the Faraday cup assembly during an ion-implanting process.

To achieve these and other objects, the present invention provides a Faraday cup assembly of a semiconductor ion-implanting apparatus that is installed adjacent to a disc mounted with a wafer for performing an ion implantation, wherein the Faraday cup assembly has an inner wall which is covered by a conductive thin film, thereby preventing the formation of an insulating layer, caused by an impurity produced during the ion implantation, on the inner wall.

The conductive thin film is fabricated to be removably attached to the inner wall to allow for periodical replacement and to thereby prevent a charge build-up caused by the insulating layer while covering only a portion of the inner wall. Additionally, the conductive thin film is fabricated by using an aluminum as a main substance in the film's composition.

Alternatively, the Faraday cup assembly of the semiconductor ion-implanting apparatus is formed with a discharge tag of a predetermined size, which is embedded into an inner wall of the Faraday cup assembly.

BRIEF DESCRIPTION OF THE DRAWINGS

The above objects and other advantages of the present invention will become apparent by describing preferred embodiments thereof in detail below and by referring to the FIG. 1 is a schematic diagram showing a Faraday cup assembly of a conventional semiconductor ion-implanting apparatus.

DETAILED DESCRIPTION OF THE PREFERRED EMBODIMENTS

Figure 1:
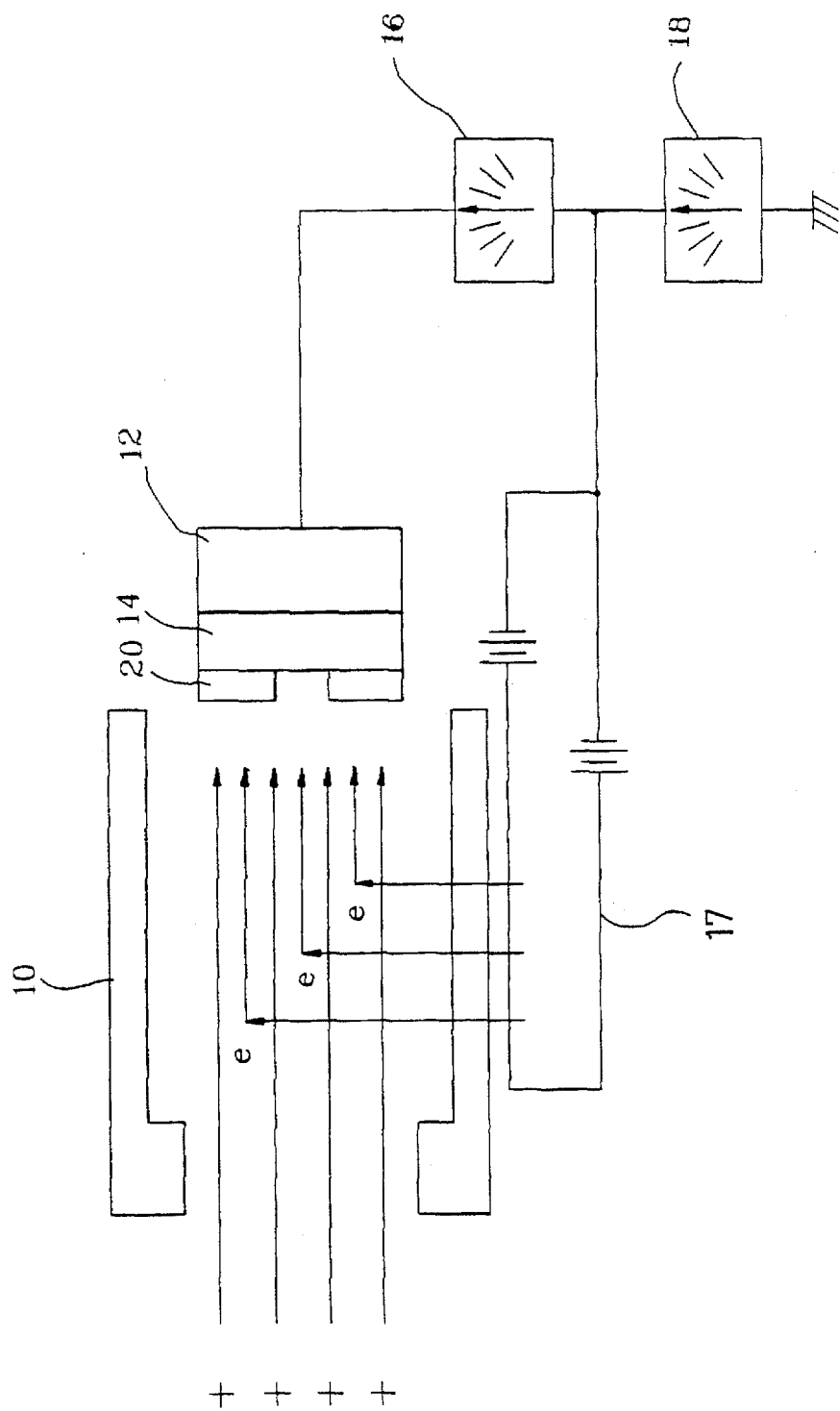
Figure 2:
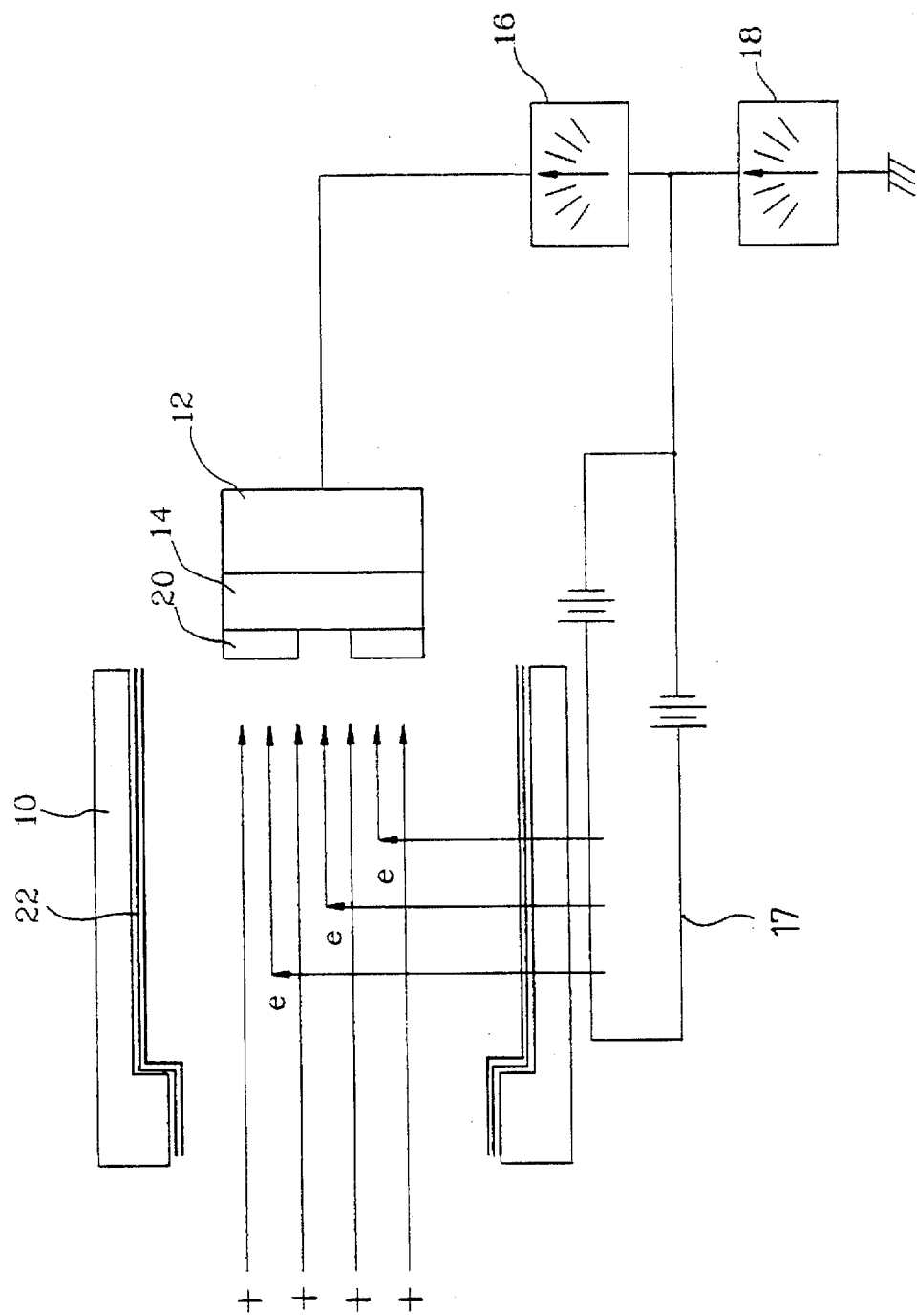
FIG. 2 is a schematic diagram showing one embodiment of a Faraday cup assembly of a semiconductor ion-implanting apparatus according to the present invention.

FIG. 2 shows one embodiment of a Faraday cup assembly of a semiconductor ion-implanting apparatus according to the present invention. In FIG. 2, the same structures as shown in FIG. 1 are designated by the same reference numerals, and thus the detailed description with respect to these same structures are not repeated.

An inner wall of Faraday cup assembly 10 is covered with a thin film 22 for preventing the direct deposition of a carbon compound which is an impurity. Thin film 22 is fabricated by Using a composition with an aluminum substance having a conductive property as a main component, which film may have a multiple structure with several layers, as required. The inner wall may be completely covered by the conductive film 22, although partial coverage is contemplated within the scope of the present invention.

Since the thin film 22 covering the inner wall is fabricated to have the same conductive property as that of Faraday cup assembly 10, there is no deviation in the current flow caused by the thin film 22. Therefore, thin film 22 exerts no influence when the apparatus forms a current path which is required for a backward bias for neutralization and secondary electron generation control.

In the state where thin film 22 covers the inner wall of Faraday cup assembly 10, the ambient conditions of the neutralization and secondary electron generation control within Faraday cup assembly 10 is constantly maintained. Thus, positive ions are implanted into wafer 14 in the normal ambient condition.

When the positive ions are implanted into photoresist 20, the carbon compound is produced and then deposited on the surface of thin film 22.

Thin film 22 is periodically removed and replaced as necessary depending on the operating time of the apparatus and the dosage of the ion, so that the insulating layer created heretofore by the carbon compound impurity is thereby eliminated.

Consequently, the path in Faraday cup assembly 20 for the ambient condition of the neutralization and secondary electron generation control is smoothly formed at all times, and micro-discharge does not occur.

Since the micro-discharge is prevented, impurities from the discharge are not scattered onto the wafer and wafer contamination and quality inferiority are reduced or avoided. Also, the explosion resulting from the micro-discharge does not occur and this protects the inner wall of the Faraday cup assembly 10.

Figure 3:
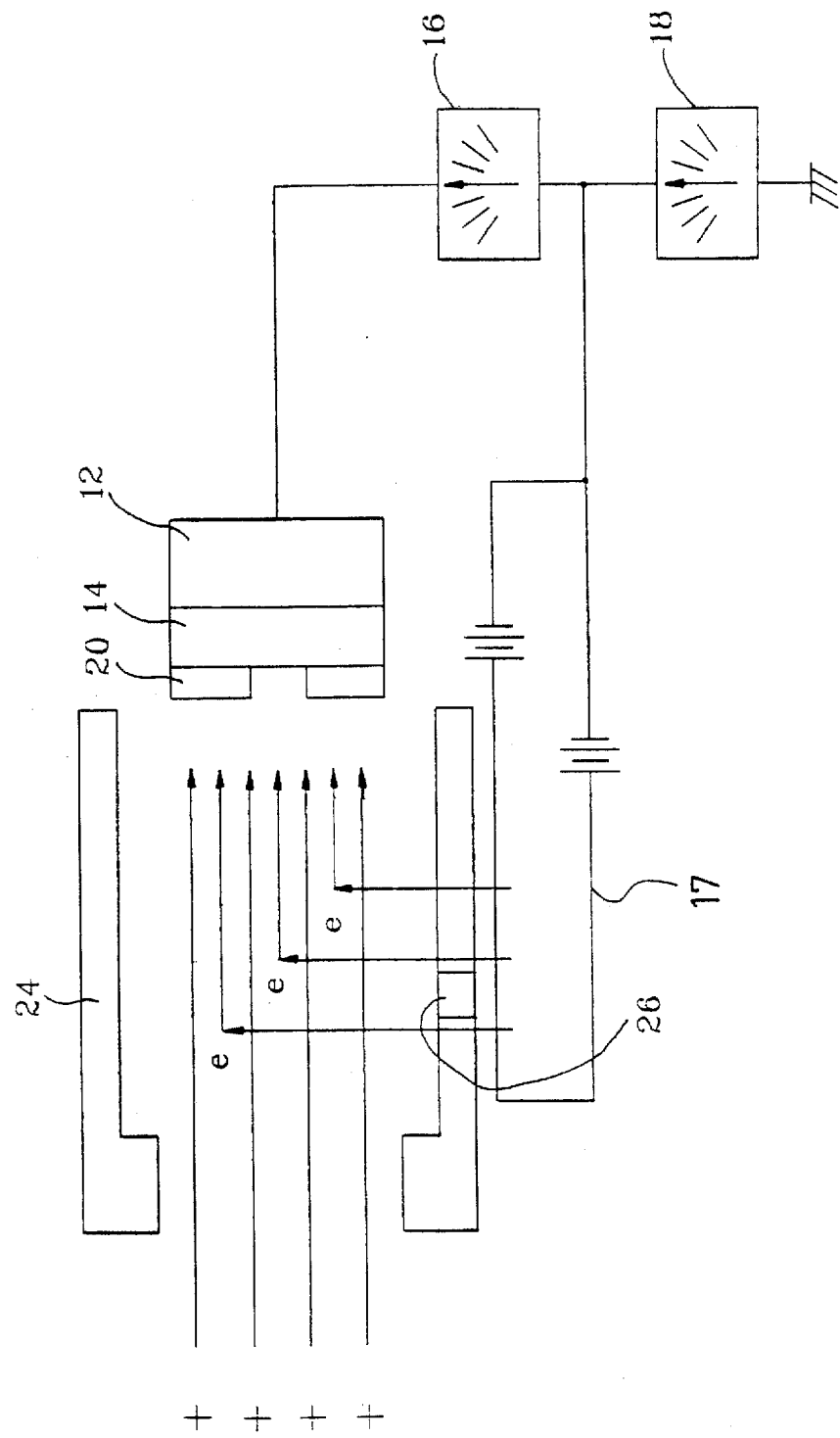
FIG. 3 is a schematic diagram showing another embodiment of the Faraday cup assembly of the semiconductor ion-implanting apparatus according to the present invention.

FIG. 3 is a schematic diagram showing another embodiment of the Faraday cup assembly of the semiconductor ion-implanting apparatus according to the present invention. In FIG. 3, the same structures as shown in FIGS. 1 and 2 are designated by the same reference numerals, and thus the detailed descriptions with respect to these same structures are not repeated.

In FIG. 3 the Faraday cup assembly is modified. Specifically, Faraday cup assembly 24, for neutralizing and controlling any secondary electron that are generated with respect to the ion beam, is formed with a via hole in a predetermined area, and a discharge tag 26 of a conductive substance is embedded into the via hole.

Tag 26 may be joined by a general coupling method such as an interference fit or screw fit, so long as the coupling and separating are easily accomplished to readily permit its replacement.

Accordingly, once the typical ion implantation is performed under conditions where the embedded tag 26 has been fabricated to have the same conductive property as the Faraday cup assembly 24, the carbon compound (i.e., the impurity resulting from ion implantation in photoresist 20) is generated and then deposited onto the inner wall of Faraday cup assembly 24 and tag 26.

If tag 26 is periodically replaced as necessary depending on the operating time of the ion implanting apparatus and the ion dosage, the insulating layer formed at the tag portion 26 does not affect the path formation.

Therefore, the ambient path for neutralizing and controlling secondary electron generation is formed via tag 26 of Faraday cup assembly 24 to prevent the occurrence of the micro-discharge.

As a result, the contamination and quality inferiority of the wafer and damage to the Faraday cup assembly, which are created by a micro-discharge, do not appear. The ion implanting process thus performs smoothly, and the contamination and quality inferiority of the wafer are prevented. This results in enhanced yields of higher quality wafers. Furthermore, the damage to the ion-implanting apparatus is prevented, which is effective in maximizing the durability and reliability of the apparatus.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A Faraday cup assembly of a semiconductor ion-implanting apparatus for performing an ion implantation is installed adjacent to a disc upon which a wafer can be mounted, wherein an inner wall of said Faraday cup assembly is covered by a conductive thin film to reduce or prevent the formation of an insulating layer, caused by an impurity produced during said ion implantation, on said inner wall.

2. The Faraday cup assembly of a semiconductor ion-implanting apparatus as claimed in claim 1, wherein said conductive thin film is fabricated to be removeably attached to said inner wall for periodical replacement, thereby preventing the buildup of a charge caused by said insulating layer.

3. The Faraday cup assembly of a semiconductor ion-implanting apparatus as claimed in claim 1, wherein said conductive thin film is formed to cover only a portion of said inner wall.

4. The Faraday cup assembly of a semiconductor ion-implanting apparatus as claimed in claim 1, wherein said conductive thin film is composed of a material having aluminum as a main component.

5. The Faraday cup assembly of a semiconductor ion-implanting apparatus as claimed in claim 2, wherein said conductive thin film is composed of a material having aluminum as a main component.

6. The Faraday cup assembly of a semiconductor ion-implanting apparatus as claimed in claim 3, wherein said conductive thin film is composed of a material having aluminum as a main component.

7. The Faraday cup assembly of a semiconductor ion-implanting apparatus as claimed in claim 4, wherein said conductive thin film is composed of multiple layers.

8. The Faraday cup assembly of a semiconductor ion-implanting apparatus as claimed in claim 5, wherein said conductive thin film is composed of multiple layers.

9. The Faraday cup assembly of a semiconductor ion-implanting apparatus as claimed in claim 6, wherein said conductive thin film is composed of multiple layers.

10. A Faraday cup assembly of a semiconductor ion-implanting apparatus for performing an ion implantation is installed adjacent to a disc upon which a wafer can be mounted, wherein an inner wall of said Faraday cup assembly is embedded with a discharge tag of a predetermined size.

11. The Faraday cup assembly of a semiconductor ion-implanting apparatus as claimed in claim 10, wherein a via hole is formed in said inner wall, and said tag is embedded into said via hole.

12. The Faraday cup assembly of a semiconductor ion-implanting apparatus as claimed in claim 11, wherein said tag is removably coupled into said via hole with an interference fit.

13. The Faraday cup assembly of a semiconductor ion-implanting apparatus as claimed in claim 11, wherein said tag is removably coupled into said via hole with a screw means.

* * * * *